United States Patent

Strömmer et al.

Patent Number: 5,173,927
Date of Patent: Dec. 22, 1992

[54] FREQUENCY DETECTOR SYSTEM ON A DIGITAL PHASE LOCKED LOOP

[75] Inventors: Esko K. J. Strömmer, Oulu; Raimo K. Kivari, Haukipudas; Juha H. Tenhunen, Oulu, all of Finland

[73] Assignee: Nokia Mobile Phones Ltd., Salo, Finland

[21] Appl. No.: 621,089

[22] Filed: Nov. 29, 1990

[30] Foreign Application Priority Data

Dec. 1, 1989 [FI] Finland .................. 895767

[51] Int. Cl.$^5$ .............................. H03D 3/18
[52] U.S. Cl. ........................ 375/81; 375/119; 375/120; 328/138; 329/325; 329/327; 329/341; 340/825.71
[58] Field of Search .............. 375/81, 119, 120; 329/316, 325, 327, 341; 328/138; 340/825.71; 455/35

[56] References Cited

U.S. PATENT DOCUMENTS

| | | | |
|---|---|---|---|
| 4,534,043 | 8/1985 | Krishnan | 375/104 |
| 4,614,910 | 9/1986 | Ishigaki et al. | 375/81 |
| 4,626,796 | 12/1986 | Elder | 331/1 A |
| 4,698,769 | 10/1987 | McPherson et al. | 364/724.09 |
| 4,733,169 | 3/1988 | Grindahl | 324/79 D |
| 4,803,705 | 2/1989 | Gillingham et al. | 375/120 |
| 4,829,545 | 5/1989 | Guzik et al. | 375/120 |
| 5,005,190 | 4/1991 | Itoi | 375/119 |

*Primary Examiner*—Curtis Kuntz
*Assistant Examiner*—Young Tse
*Attorney, Agent, or Firm*—Darby & Darby

[57] ABSTRACT

A frequency detection system is based on a digital phase locked loop, the detection system being especially suitable for use in noisy environments like supervisory audio tone (SAT) detection in AMPS and TACS mobile telephone systems. In addition to the digital phase locked loop (4), the frequency detection system according to the invention incorporates a detector circuit (5), which comprises a detection timer (6) and two phase detectors VI1 (7) and VI2 (8). The timer (6) forms a detection sequence of desired length, at the end of which the output signal (SATVAL) of the detector circuit is updated. The first phase detector VII (7) has a phase window in which it counts those falling edges of the synchronized input signal (SSAT) that coincide with the window. The second phase detector VI2 (8) also has a phase window of its own in which it counts those falling edges of the synchronized input signal (SSAT) that coincide with its window. The phase windows are made up of the basic output signal of the digital phase locked loop (SO1) and its 2nd, 4th, and 8th harmonics (SO2, SO4 and SO8). If at the end of a detection sequence the counter of the first phase detector VII (7) exceeds, and the counter of the second phase detector VI2 (8) falls short of their predetermined threshold values, the detection circuitry (5) will indicate that the frequency of the received signal is correct.

11 Claims, 2 Drawing Sheets

FREQUENCY DETECTOR SYSTEM ON A DIGITAL PHASE LOCKED LOOP

BACKGROUND OF THE INVENTION

The invention relates to a frequency detector for use in a radio telephone.

During a telephone call placed in both the AMPS and TACS radio telephone systems, a base station transmits an analog sinusoidal control signal, a so-called SAT signal (supervisory audio tone), which supervises the connection quality between a mobile telephone and base stations. A mobile station must be capable of receiving the SAT signal, of interpreting it correctly as a predetermined nominal frequency, and of retransmitting the regenerated SAT signal to the base station. The nominal frequencies of the SAT signal are 5970, 6000 or 6030 Hz. At the time of a call set-up and in a hand-off situation, a mobile telephone receives information on the available SAT frequency from a digital control message transmitted by the base station, in which the assumed frequency is given. If the mobile telephone does not receive any SAT signal within a predetermined period, or if the received frequency differs from that given in the control message, the telephone call is disconnected. It is known in the art to use an analog phase locked loop to detect the SAT signal in a modem circuit of a subscriber apparatus. The analog phase locked loop counts the pulses of its output signal. In this prior art system the incoming SAT signal is applied via a STIF bandpass filter to an analog comparator, in which a rectangular wave is formed from the signal. Thereafter, the signal is applied to an analog phase lock loop and to an SAT frequency detector. The detector functions by comparing the frequency of the received rectangular wave with the crystal frequency of the modem circuit. The comparison takes place with the aid of a counter chain, and the modem circuit reports the result once in 85 ms. The disadvantages of a system such as this are that it has too low a tolerance for input signal noise, has phase noise in the output signal, which is manifest in a widening of the spectrum on both sides of the SAT frequency, requires a rather large number of components, requires surface area on the circuit board, and needs to be tuned during production.

It is also known in the art to use systems based on a digital phase locked loop, for SAT signal detection. The systems attempt to eliminate the problems caused by an analog phase loked loop. With these system there is used, for example, a modem circuit which is made up of three microcircuits, one of which contains the SAT components. The size of this circuit is approximately 3000 gate equivalents, and it is packed on an 80-pin IC-package. The detector part of this circuit examines only the locking of the phase locked loop, and it is rather large. Another modem circuit has two microcircuits, which require as many as seventeen external components in order to function. In spite of the digital phase locked loop its detector part is based on detecting, the locking of the phase lock loop by analog integration. Also other known systems require external components.

SUMMARY OF THE INVENTION

The object of the present invention is to provide a frequency detection system, e.g., an SAT detection system, which is based on a digital phase locked loop that, does not require external components, is easy to integrate into one micro-circuit, does not need to be tuned and tested during production, and functions better with a noisy input signal than the prior art systems.

The detection system comprises a circuit for synchronizing a digitized input signal (formed from a signal being examined) to a system clock signal, a digital phase locked loop (DPLL) which produces a regenerated digital output signal system from the synchronized digital input signal and a detector circuit which determines if input signal is within a predetermined frequency range. The phase difference sensed by the DPLL between the regenerated digital output and the input signals is linearly dependent on the difference between the frequency of the synchronized input signal and a selectable center frequency of the phase locked loop. The detector circuit detects whether the synchronized signal is within a predetermined detection frequency range. This invention may be applied in the SAT detector of the modem circuit for TACS and AMPS mobile telephones to detect if the SAT signal is being received.

The invention is characterized in that the detector circuit of the frequency detection system comprises a detection timer which forms a detection sequence of the desired length, at the end of which the detection circuitry output signal (SATVAL) is updated. A first phase detector has a first window during which it counts the falling edges of the synchronized input signal (SSAT) coinciding with the window. A second phase detector has a second window during which it counts the falling edges of the synchronized input signal coinciding with the second window. The first and second windows are made up from the regenerated SAT signal (S01) formed by the digital phase locked loop and its 2nd, 4th, and 8th harmonics (S02, S04, S08). If at the end of a detection sequence the counter of the first phase detector exceeds, and the counter of the second phase detector falls short of, their predetermined threshold values, the detector circuit will interpret the frequency of the received signal as correctly falling within the detection frequency range.

At the beginning of a call or in a hand-off situation (i.e., a transfer from one base station to another), a base station transmits a digital control message which includes an SCC code (SAT color code), which detects the SAT frequency used during the call:

| SCC1 | SCC0 | SAT frequency |
| --- | --- | --- |
| 0 | 0 | 5970 Hz |
| 0 | 1 | 6000 Hz |
| 1 | 0 | 6030 Hz |
| 1 | 1 | not in use |

These codes SCC1 and SCC0 are applied to the digital first-order phase locked loop, in which case its center frequency will be the frequency indicated by their combination, according to the above table. The telephone's modem circuit detects an analog input signal will arrive. This signal, which may, in addition to a SAT signal of any of the above frequencies, contain voice or data. The input signal is bond-pass filtered, threshold detected in a comparator to digitize it, and synchronized, for example in flip-flop circuits, with the detection system clock signal. Thereafter the digital synchronized signal is applied to the digital phase locked loop. The phase locked loop itself may be a standard circuit knows in the art, and its structure does not constitute a part of the present invention. The phase locked loop produces a regenerated digital SAT signal and its 2nd, 4th, and 8th harmonics, from which can be formed an analog regenerated SAT signal to be transmitted to the base station. The SAT signal obtained from the phase locked loop is applied to the detector circuit according to the invention, which at the end of its detection sequence produces an output signal that provides information on whether a SAT signal of the correct frequency has been received.

BRIEF DESCRIPTION OF THE DRAWINGS

The invention is described below in greater detail, with reference to the accompanying figures, in which.

DESCRIPTION OF THE PREFERRED EMBODIMENTS

Figure 1:
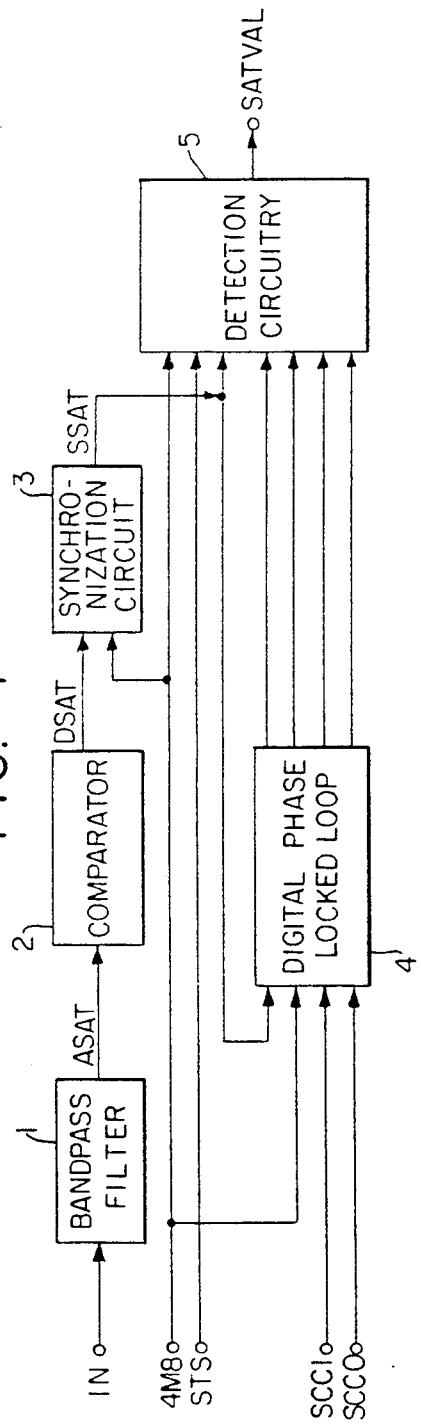
FIG. 1 depicts a block diagram of a frequency detection system according to the present invention.

A frequency detection system according to the present invention is shown in block diagram form in FIG. 1: The IN signal is the analog signal input into the detection system from the modem circuit. The signal signal may contain voice and data as well as the SAT signal. The input signal is filtered in a bandpass filter 1, digitized in a threshold comparator 2 (is converted to a rectangular wave), i.e., it and sent to synchronizing circuit 3, which may be a flip-flop circuit, to be synchronized with the system clock signal (4MB); of the digital phase locked loop (DPLL) 4. In this embodiment, the system clock's frequency is 4.8 MHz. The DC level of the output of the bandpass filter 1 has to be the same as the DC level of the comparator 2, since the digitized signal has to be symmetrical. In addition to the clock signal and the IN signal, the frequency detection system also receives a signal (STS) from the command word of the modem circuit. The STS signal serves as the detector sensitivity selector and selects one of the two possible noise levels at which the detector operates. The frequency detection system also receives signals SCC1 and SCC0, which determine the average frequency of the phase locked loop, as described above. The phase locked loop 4 is a first-order digital phase locked loop, its essential characteristic relating to the detection circuitry being that the phase difference between the incoming and outgoing signals is linearly dependent on the difference between the input signal frequency and the center frequency of the phase locked loop.

The phase locked loop 4 forms a regenerated digital SAT signal (S01) and its 2nd, 4th, and 8th harmonics (S02, S04, S08), from which an analog SAT signal can be formed and transmitted to the base station. When necessary, it is possible to obtain from the phase locked loop other harmonic components in addition to the above.

Figure 2:
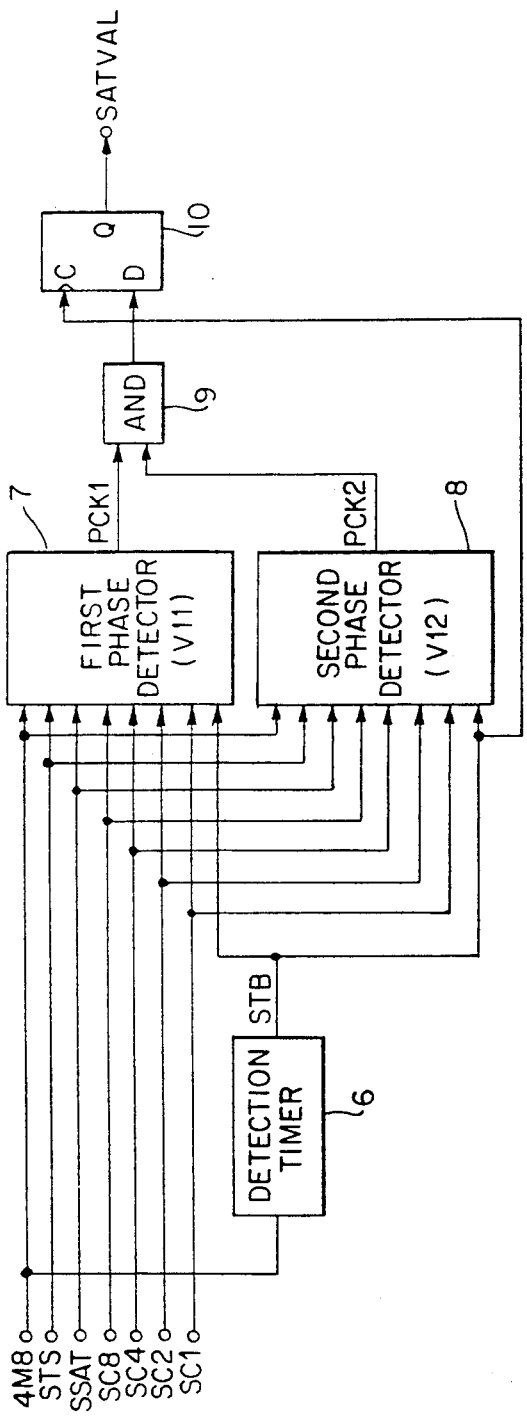
FIG. 2 depicts a block diagram of the detector circuit of the frequency detection system.

The detector circuit 5, a block diagram of which is shown in FIG. 2, is essential for the operation of the present invention. The input signals of the detector circuit are the digital phase locked loop output signals S01, S02, S04, S08 and the received synchronized SAT signal SSAT i.e., to SAT signal, synchronized with the clock signal), as well as the sensitivity selector signal STS and the clock signal, 4.8 MHz. The detector circuit includes a detection timer 6, which forms a detection sequence of the desired length, at the end of which the detector circuit 5 produces an output signal (SAT-VAL), which is updated as indicated if there has been reception of a SAT signal of the correct frequency. The detector circuit 5 includes two phase detectors VI1 (7) and VI2 (8), based on counters Each of the detectors VI1 and VI2 has its own phase window made up of the signal SO1 and its harmonics, obtained from the phase locked loop. The detectors VI1 and VI2 count the falling edges of the input signal SSAT which coincide with the phase window. The windows are located in such a manner, that, when the phase locked loop 4 is locked within a certain frequency range (called the detection frequency range), within the lock frequency range of the phase locked loop, VI1 is counting continuously and VI2 is not counting.

Figure 3:
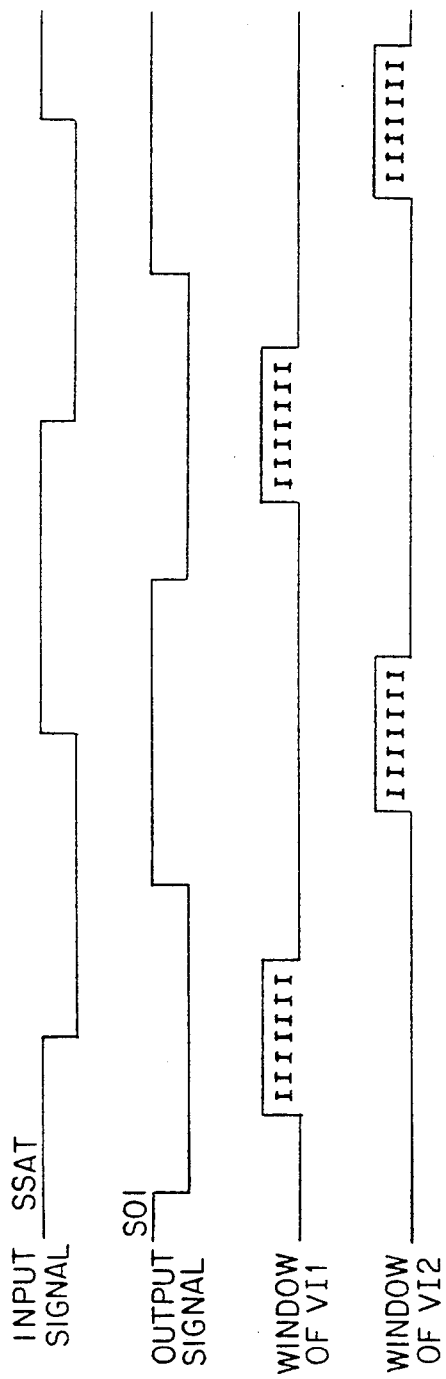
FIG. 3 depicts the typical locations and widths of the detection windows of the phase detectors.

FIG. 3 illustrates the typical width and location of the phase windows in relation with the incoming and outgoing signals when the phase locked loop 4 is in the locked state. It can be seen that the window of the phase detector VI1 is at the falling edge of the input signal SSAT and the window of VI2 is at the rising edge. Only VI1 is counting, since only the falling edges are counted. Furthermore, in this example VI1 counts only one falling edge per window even if there happen to be more of them, for example because of noise. The detection timer 6 determines the length of the detection sequence, and the counters are always zeroed (i.e., reset) at the beginning of a detection sequence. Whether an incoming signal SSAT is within the detection frequency range can be determined from the final value of the counters at the end of the detection sequence, this is because VI1 ideally counts all the falling edges of the input signals and VI2 does not count a single input signal edge. However, the locations of the edges of an input signal SSAT usually cannot be predicted with such precision because of noise, thus, a threshold value somewhat higher than what the noise would produce is selected for the counter of VI1 and somewhat lower than what the noise would produce for the counter of VI2. If at the end of a detection sequence the counter VI1 exceeds and the counter of VI2 falls short of their respective threshold values, the detector circuit will give a positive result (i.e. that the received signal is really a SAT signal). Both of these conditions must be in force simultaneously. This condition is checked at the AND gate 9.

The frequency, detection system characteristics, such as frequency range and noise sensitivity, can be affected by selecting suitable values for certain parameters. Such parameters include (with the values in parentheses providing the preferred SAT detection values):

detection sequence length (80 ms)
center frequency of the phase locked loop (depends on the state of the SCC0 and SCC1 signals, as discussed above;)
the phase locked loop bondwidth (+/−31 Hz);
width of the phase window of VI1 (90°) and the location of its center point (90° after the falling edge of the output signal);
width of the phase window of VI2 (360°, i.e., the counter counts all edges) and its center point location
threshold value of the counter of VI1 (192 or 224, depending on the state of the STS signal) and threshold value of the counter of VI2 (640); and
the system clock frequency (4.8 MHz).

The detection sequence length has to be selected as a compromise between the detector speed and its noise properties. It is advantageous to select the center frequency of the phase locked loop so that it is the same as the center frequency of the detection frequency range. As seen in FIG. 3 in this embodiment 90° from the falling edge, of the output signal SO1 is selected as the VI1 detection window center point location and 270° from the falling edge of the output signal is selected as the VI2 detection window center point location. The bandwidth of the phase locked loop must be greater than or equal to the width of the detection frequency range. Widening the phase locked loop band speeds up its step response but increases the noise in the output signal. On the other hand, if the bandwidth of the phase locked loop is very close to the width of the detection frequency range, the noise characteristics on the edges of the detection frequency range are clearly poorer than in the middle of the detection band. The detection frequency range width multiplied by two has been found to be a suitable phase locked loop bandwidth in the SAT application. When a suitable phase locked loop bandwidth has been selected, the width of the phase window of VI1 is selected on the basis of the following formula:

VI1 phase window width =

$$\frac{\text{bandwidth of the detection frequency range}}{\text{phase locked loop bandwidth}} \times 180°$$

Beyond this there is no exact requirement for the width of the phase window of VI2, but it is recommended to be the width of the window of VI1. When the other parameters are selected, the threshold values of the counters can be determined experimentally at such levels that the desired noise characteristics are accomplished. The higher the threshold value of the counter of VI1 and the lower the threshold value of the counter of VI2, the lower the noise tolerance of the detection system.

According to the parameter list presented above and the Formula, the width of the detection frequency range in the SAT application of this embodiment is +/−15 Hz.

Figure 4:
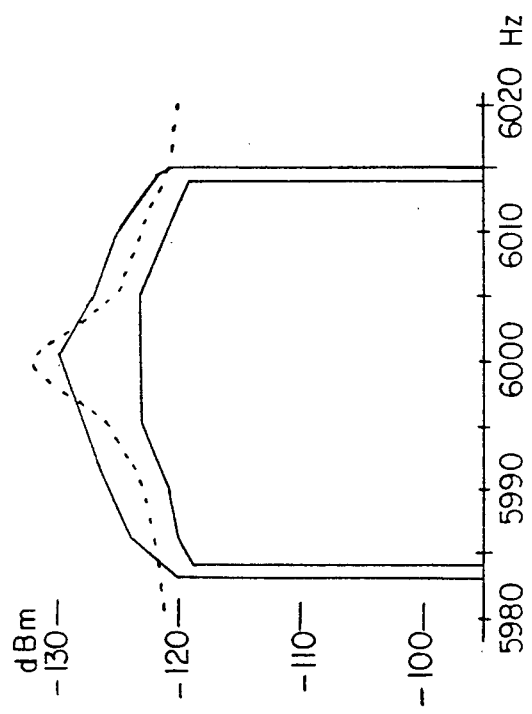
FIG. 4 depicts the operation of the frequency detector, with a noisy input signal.

The operation of the detector according to the invention was investigated using various radio signal levels and various SAT frequencies, and the curves depicted in FIG. 4 were obtained. The average frequency selected for the phase locked loop was 6000 Hz and the threshold value of VI1 was 192. The dashed line depicts a curve below which the phase locked loop was in the locked state. Below the lower uninterrupted line the SATVAL signal was high, and above the upper uninterrupted line the SATVAL signal was low. Between these lines the SATVAL signal varied its state. According to this figure, the detector still functioned when the rf signal level was −123 dBm. In an application integrated on a silicon chip, the sensitivity was −123 dBm.

Because of its entirely digital implementation, the frequency detection system according to the present invention can be completely integrated into one microcircuit without difficulty, and it need not be tuned and tested in production. The elimination of the external components of the modem circuit reduces costs and saves labor. The system somewhat reduces the silicon chip surface area requirement, since the harmonic components of the SAT frequency, obtained from the phase locked loop, enable the analog components of the outgoing SAT signal to be implemented in a simpler manner. In the system the noise level of the outgoing signal is low and the detection of the SAT signal is good at the edges of the audibility area of a base station.

Even though the invention has been described specifically in the detection of a SAT signal in the modem circuit of a radio telephone, it is self-evident that it can also be used in other contexts in which frequency detection is required. Such potential uses include various applications in measuring and communications, in which information is required regarding whether an input signal is within the desired frequency range or not. If information regarding the frequency is not obtained from a control message in the input signal, as is the case in the SAT application, the frequency detection system can be modified so that it will seek the input signal frequency by experimenting with various system clock frequencies, with center frequencies of the phase locked loop, and with detector sensitivities (threshold values of the VI1 and VI2 counters and the width of the phase windows).

We claim:

1. A frequency detection system for detecting if an analog input signal frequency is within a predetermined frequency range, comprising:

digitizing means for receiving the analog input signal and converting the analog input signal into a digital input signal;

a synchronization circuit for synchronizing the digital input signal with a system clock signal and producing a synchronized input signal;

a digital phase locked loop having a selectable center frequency and a bandwidth at least as wide as the predetermined frequency range, the phase locked loop receiving the synchronized input signal and producing a digital output signal having 1st, 2nd, 4th, and 8th harmonics, the digital output signal being produced from the synchronized input signal and having a phase determined by a phase difference between the synchronized input signal and the center frequency;

detector circuit means for detecting whether the synchronized input signal has a frequency within the predetermined frequency range, the detector circuit means including:

(a) a timer responsive to the synchronized input signal, the timer establishing a detection sequence having a beginning and an end;

(b) a first phase detector which counts one edge of the synchronized input signal occurring within a first phase window during the detection sequence, the first phase window being formed from the digital output signal of the digital phase locked loop and located to include the occurrence of one edge of an ideal synchronized signal within the predetermined frequency range, the count in said first phase detector being responsive to the beginning of the detection sequence for resetting the count and responsive to the end of the detection sequence for producing a first status signal, the first status signal indicating whether the count of the one edge counted by the first phase detector exceeds a predetermined minimum count; and (c) a second phase detector which counts the one edge of the synchronized input signal occurring within a second phase window during the detection sequence, the second phase window being formed by the digital output signal of the digital phase locked loop and located to include another edge of an ideal synchronized signal within the predetermined frequency range, the count in said second phase detector being responsive to the beginning of the detection sequence for resetting the count and responsive to the end of the detection sequence for producing a second status signal, the second status signal indicating whether the count of the edges counted by the second phase detector is less than a predetermined maximum count; and output means responsive to said first and second status signals for forming a signal indicating that the synchronized input signal is within the detection frequency range when the first and second status signals are both received or the synchronized input signal is not within the detection frequency range when either of the status signals is not received.

2. The frequency detection system of claim 1, wherein the phase-locked loop's selectable center frequency is identical to a center frequency of the predetermined frequency range to be detected, the first phase window has a center point located 90° after a falling edge of the digital output signal, and the second phase window has a center point located 270° after the falling edge of the digital output signal.

3. The frequency detection system of claim 1, wherein the first phase window has a width defined by the formula:

first phase window width =

$$\frac{\text{bandwidth of the predetermined frequency range}}{\text{phase locked loop bandwidth}} \times 180°$$

and the second phase window has a freely selectable width.

4. The frequency detection system of claim 3, wherein detection sensitivity and noise tolerance can be regulated by adjusting the predetermined minimum and maximum counts of the first and second phase detectors, and the first and second phase window widths.

5. The frequency detection system of claim 1, wherein the digitizing means includes a band-pass filter for filtering the analog signal and a comparator for converting the filtered analog input signal into a digital input signal.

6. The frequency detection system of claim 1, wherein the digital phase locked loop's selectable center frequency is selected by a noise tolerance selection signal.

7. The frequency detection system of claim 6, wherein the noise tolerance selection signal determines the predetermined maximum and predetermined minimum.

8. The frequency detection system of claim 1, wherein the output means includes an AND-gate which combines the first and second status signals, and wherein the frequency detection system further includes a storage means for storing the output of the AND-gate, and producing an output signal of the frequency detection system, the output means being responsive to the end of the detection sequence for updating the output signal of the frequency detection system.

9. The frequency detection system of claim 8, wherein the storage means is a flip-flop, the flip flop being clocked by the end of the detection sequence.

10. The frequency detection system of claim 1, wherein the one edges of the synchronized signal are the falling edges and the other edges are rising edges.

11. The frequency detection system according to any one of the preceeding claims, wherein either of the system clock signal and selectable center frequency of the phase-locked loop may be changed to modify the system to detect signals of different frequencies without changing the other parameters of the detector circuit.

* * * * *